United States Patent [19]

Cave et al.

[11] 4,274,018
[45] Jun. 16, 1981

[54] SATURATION LIMITED BIAS CIRCUIT FOR COMPLEMENTARY TRANSISTORS

[75] Inventors: David L. Cave; Robert B. Davies, both of Tempe, Ariz.

[73] Assignee: Motorola, Inc., Schaumburg, Ill.

[21] Appl. No.: 60

[22] Filed: Jan. 2, 1979

[51] Int. Cl.³ .................. H03K 19/003; H03K 19/082
[52] U.S. Cl. ................................. 307/300; 307/299 B; 307/313; 330/267; 307/456; 307/549
[58] Field of Search .................. 307/200 A, 214, 262, 307/237, 299 B, 300, 313, 296; 330/267, 268

[56] References Cited
U.S. PATENT DOCUMENTS 4,041,407  8/1977  Main ..................................... 330/268

Primary Examiner—John Zazworsky
Attorney, Agent, or Firm—Maurice J. Jones, Jr.

[57] ABSTRACT

A clamp circuit is disclosed which includes a transistor connected between the multiple collectors of a bias current device for complementary output transistors and the output terminal of a driver circuit. The clamp transistor is rendered conductive by signals at the output terminal of the driver circuit which would otherwise heavily saturate the bias current device. The clamp transistor conducts current to provide additional needed bias to the complementary output device and to keep such current from disturbing the magnitudes of currents provided by a current generator circuit which is also connected to the bias current device.

7 Claims, 5 Drawing Figures

SATURATION LIMITED BIAS CIRCUIT FOR COMPLEMENTARY TRANSISTORS

BACKGROUND OF THE INVENTION

Modern electronic equipment often includes bias circuitry for operating pairs of complementary output transistors. For instance, solid state audio frequency and operational amplifiers usually include a pair of complementary output transistors for driving an electrical load. A driver circuit is generally coupled from an input signal source to the complementary output transistors and a bias circuit is generally coupled to both the driver circuit and the complementary output transistors. In some instances, it is desirable for the foregoing circuitry to be manufactured in monolithic integrated form to facilitate low cost, minimum space and maximum reliability.

In general, it is desirable for such bias, driver and complementary output transistors to draw currents of minimum magnitudes from the power supply. By minimizing these current drains, the cost and size of the power supply is minimized and the amount of heat created is also minimized. By minimizing the heat generated efficiency is increased because additional power is not required to operate fans or additional heat sinking is not required to keep the system within the finite temperature range over which it will operate properly. It is well known that both active components and passive components must operate within a finite temperature range or such components are likely to fail. Semiconductor devices such as bipolar transistors are susceptible to thermal runaway ending in avalanche if the temperature thereof is not controlled. Moreover, extreme temperatures can cause vaporization of the metallization on the die and of the wire bonds which connect the die to the pinouts. Hence, it is desirable to minimize current drain and thus power dissipation whenever possible without undue sacrifice in performance.

The gain and frequency response of the driver circuit and hence of the amplifier are each proportional to the bias current of the driver circuit. Some of the early complementary transistor amplifier configurations required the bias circuit to be connected in series with the driver circuit. Thus, the bias circuit and hence the complementary output devices conducted a quiescent current which was a function of the large current required by the driver stage. As a result, the biasing devices and the complementary output devices conducted a larger current than necessary which resulted in them dissipating more heat than necessary.

To solve the above problem, a prior art monolithic integrated circuit implementation was devised wherein a separate bias current supply is provided to supply the majority of the current required by the driver circuit directly to the driver circuit while bypassing the complementary biasing devices. A parallel bias current for the complementary devices is also provided to the driver circuitry to maximize the gain and bandwidth of the amplifier. Generally, the foregoing parallel current sources are implemented in integrated circuit form by utilizing multiple collector PNP current supply transistors having emitters connected to the positive supply conductor of an integrated circuit. The base electrode is connected to the collector electrode of a PNP device in a known manner to complete the prior art current supply circuit.

Dynamic input signals of a negative polarity have a tendency to render the driver circuit of the improved prior art configuration nonconductive. In this condition, the output terminal of the driver circuit commonly used in such configurations tends to approach the positive supply potential. As a result, a positive potential is applied to one of the collector electrodes of the multiple collector PNP current supply transistor. This positive potential can result in forward biasing the base-to-collector junction of the current supply transistor and thus forcing it into saturation. The forward biased junction then provides base current otherwise provided by the emitter-to-base junction. As a result, the magnitude of the base drive current available to the current supply transistor is reduced. Consequently, all of the currents provided by the composite current supply transistor are undesirably reduced in magnitude. Thus, the base drive for the complementary NPN transistor is reduced so that not enough current can be supplied to load impedances having values less than a predetermined minimum value. As a result the output signal waveform is undesirably distorted.

SUMMARY OF THE INVENTION

An object of the invention is to provide an improved bias circuit configuration for complementary transistors.

Another object of the invention is to provide a bias circuit for complementary output transistors which is suitable for being manufactured in monolithic integrated circuit form.

Still another object of the invention is to provide a bias circuit configuration for complementary transistors which minimizes distortion of the output waveform.

In brief, a circuit of one embodiment of the invention limits the saturation of a multiple collector transistor. The circuitry involves a driver circuit, an output transistor and a clamp transistor. The driver circuit has an output terminal connected to a first of the collector electrodes of the multiple collector transistor and tends to forward bias the first collector-to-base junction of the multiple collector transistor thereby forcing the multiple collector transistor into a high degree of saturation which undesirably reduces the magnitude of the drive current available to the output transistor. The output transistor includes a control electrode which is connected to another of the collector electrodes of the multiple collector transistor. The clamp transistor has a control electrode connected to the first collector electrode of the multiple collector transistor, a first main electrode which is connected to the output terminal of the driver circuit and a second main electrode which is connected to the other collector electrode of the multiple collector transistor. The potential at the output terminal of the driver circuit approaching the saturation level of the multiple collector transistor renders the clamp transistor conductive so that the current otherwise provided to the saturating collector-to-base junction of the multiple collector transistor is shunted to provide the drive needed by the output transistor.

DETAILED DESCRIPTION OF THE PREFERRED EMBODIMENT

Figure 1:
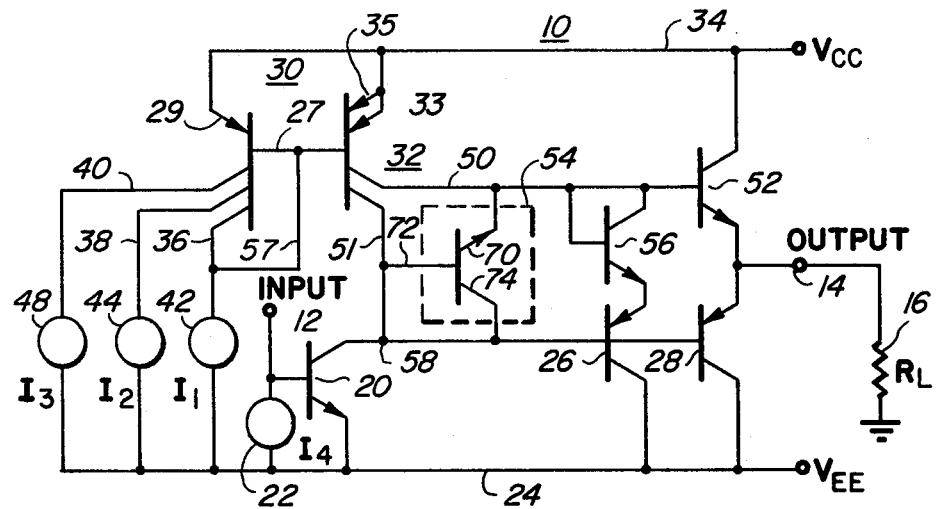
FIG. 1 is a partial block and schematic drawing of an operational amplifier including the clamp circuit of one embodiment of the invention.

FIG. 1 is a partial schematic and block diagram of an operational amplifier 10 having an input terminal 12 and an output terminal 14. Electrical load 16 is connected between output terminal 14 and ground conductor 18. NPN driver transistor 20 includes a base electrode which is connected both to input terminal 12 and through a current sink 22 to negative supply conductor 24. The emitter electrode of transistor 20 is likewise connected to negative supply conductor 24 and the collector electrode of transistor 20 is connected to the base electrodes of biasing transistor 26 and PNP complementary output transistor 28.

Multiple collector PNP current supply transistors 30 and 32 each include emitter electrodes connected to positive supply conductor 34. The base electrodes of PNP current supply transistors 30 and 32 are connected together and to collector 36 of multiple collector transistor 30. Collectors 36, 38, and 40 of multiple collector transistor 30 are respectively connected through respective current sinks 42, 44, and 48 to the negative supply conductor 24. These current sinks are representative of loads provided by other portions of amplifier circuit 10, for instance.

Multiple collector PNP transistor 32 includes a first collector 50 which is connected to the base electrode of NPN complementary output transistor 52 and another collector electrode 51 which is connected to the collector electrode of transistor 20 and to the base electrode and collector electrode of NPN clamp transistor 54. NPN diode connected bias transistor 56 includes commonly connected base and collector electrodes, which are connected to the base electrode of complementary NPN output transistor 52, and an emitter electrode connected to the emitter electrode of bias device 26. The collector electrodes of transistors 26 and 28 are connected to negative supply conductor 24 and the collector electrode of transistor 52 is connected to positive supply conductor 34.

During quiescent operation, the base-to-collector 36 connection of transistor 30 by conductor 57 enables current supply transistors 30 and 32 to provide currents at collectors 36, 38, 40, 50 and 51 which are proportional to the areas of such collectors, as will be described in more detail. The current supplied by collector 50 biases up devices 56 and 26 which provide bias potentials to the emitter-to-base junctions of complementary output transistors 52 and 28. Current supplied by collector 51 substantially biases up driver transistor 20 and the magnitude of current 51 determines the gain and bandwidth of driver transistor 20 and thus influences the gain and bandwidth of amplifier circuit 10. The currents at collectors 36, 38 and 40 of transistor 30 similarly biases up other circuits represented by respective current sinks 42, 44 and 48.

During dynamic operation, waveforms having a variety of shapes can be applied to input terminal 12. Ideally, these waveforms are inverted, amplified and recreated across load resistor 16. Ideally, as the instantaneous waveform at input terminal 12 increases in a positive direction, for instance, transistor 20 is rendered more conductive thereby reducing the dynamic voltage driver circuit potential at output terminal 58 connected to the collector of transistor 20. As a result, terminal 58 is forced to swing toward negative supply $V_{EE}$. In turn device 28, acting as an emitter follower causes the voltage across load resistor 16 to swing negative. Thus amplifier 10 tends to invert the output signal with respect to the input signal.

Alternatively, if a negative going input signal is applied to input terminal 12 then transistor 20 is rendered less conductive thereby causing the collector voltage at terminal 58 to increase. This results in transistor 28 being rendered less conductive and transistor 52 being rendered more conductive so that the voltage across load 16 swings positive.

If the voltage at the collector of transistor 20 and hence at terminal 58 becomes too positive in response to a negative driving signal then the junction between collector 51 and the base of transistor 32 tends to forward bias as transistor 32 saturates. As a result, part of the reference current I1 is undesirably supplied through the collector-to-base junction of transistor 32 rather than through the emitter-to-base junctions of transistors 30 and 32. Consequently, the magnitudes of currents I1, I2, I3 and the base drive for the complementary output transistor 52 becomes undesirably diminished in magnitude.

Figure 2:
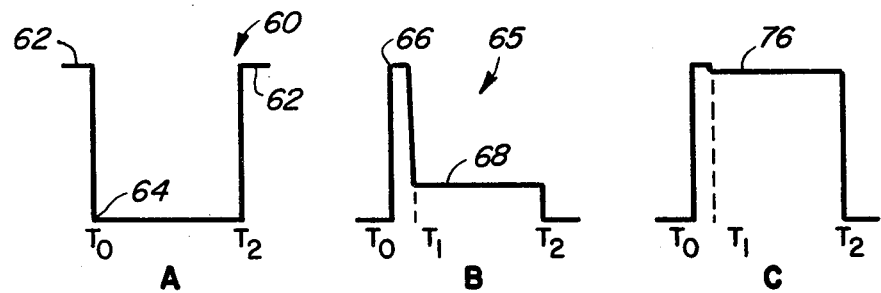
FIG. 2 shows waveforms illustrating the operation of the circuit of FIG. 1 both with and without the clamp circuit of the invention.

More specifically, FIG. 2A shows the waveform 60 of an input pulse applied to input terminal 12 which has magnitude that decreases from a relatively high level 62 to a relatively low level 64 at time, T0 and remains at magnitude 64 until time, T2 when it returns to level 62. Thus, as shown by FIG. 2B, at time T0 the output waveform rises to a level 66. However, the voltage having a high potential at terminal 58 forward biases the base-to-collector 51 junction of transistor 32 which results in the amount of current supplied by collector 50 to the base of transistor 52 to be decreased at time, T1. Accordingly, this undesirable affect results in output waveform 65 distorting to level 68 and remaining there until time, T2. The time delay is caused by PNP transistor 32 not operating as rapidly as NPN transistor 20.

Figure 3:
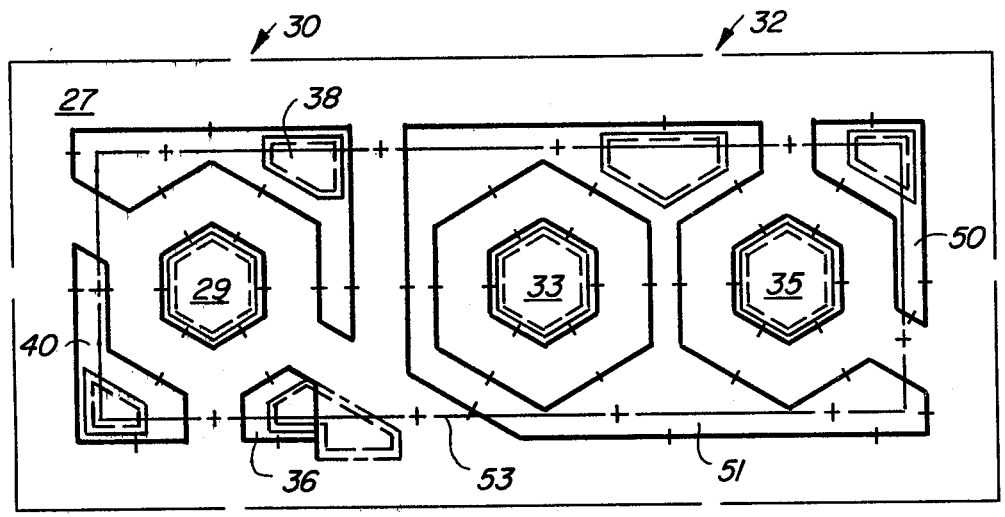
FIG. 3 is a topographical diagram of the composite current supply devices of FIG. 1 illustrating their relative geometries.

FIG. 3 is a topographical representation of the structures of transistors 30 and 32 of FIG. 1. Some corresponding reference numbers are used in FIGS. 1, 3, 4A and 4B. More specifically, area 27 represents the common base areas of transistors 30 and 32, the emitter of transistor 30 is represented by hexagonal area 29 and the dual emitters 33 and 35 of transistor 32 are represented by reference numbers 33 and 35. Collectors 36, 38 and 40 of transistor 30 are shown along with collectors 50 and 51 of transistor 32. Area 53 represents the buried layer. No metallization is shown in FIG. 3.

Figure 4A:
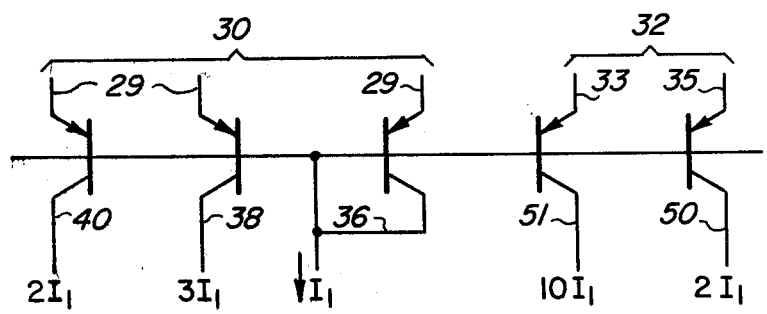
FIGS. 4A and 4B are schematic representations of the devices of FIG. 3 illustrating their operation in both the clamped and unclamped modes.

As shown in FIG. 4A, under normal conditions collector 36 provides a reference current, $I_1$. Since collector 40 has twice as much area facing emitter 29 as collector 36, collector 40 collects a current of $2I_1$. Similarly since collector 38 has three segments facing emitter 29 it collects a current of $3I_1$. Transistor 32 includes a collector 51 having six segments facing emitter 33 and four segments facing emitter 35. Thus, collector 51 collects a current of $10I_1$. Alternatively, transistor 32 has a collector 50 having two segments facing emitter 35 and therefore collects a current of $2I_1$.

Figure 4B:
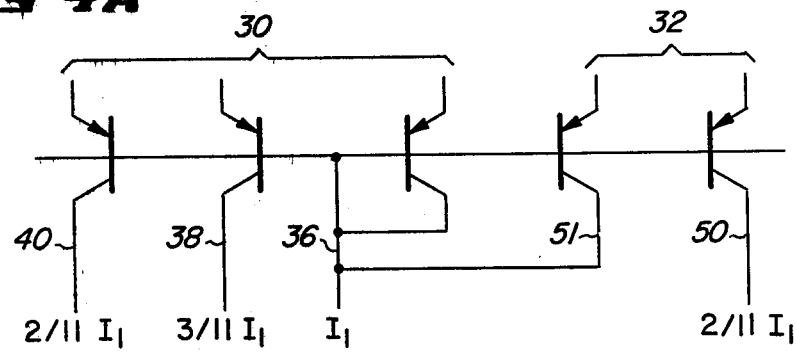

FIG. 4B indicates the situation when device 32 including collector 51 saturates. Under these conditions, collector 51 is shorted to collector 36 through the forward biased base 27-to-collector 51 junction. As a result, the reference current is now supplied by both collector 51 and collector 36. Therefore, the area ratios then cause the current of collector 40 to drop to $2/11I_1$, the collector current of transistor 38 to drop to $3/11$ of $I_1$ and the current of collector 50 to drop to $2/11I_1$. Under these conditions, amplifier 10 cannot operate in a satisfactory manner as shown by FIG. 2B, for instance.

The NPN clamp or current shunt transistor 54 solves the above problems. Transistor 54 includes an emitter electrode 70 which is connected to collector electrode 50, base electrode 72 which is connected to collector electrode 51 and to collector electrode 74 which is connected to terminal 58.

NPN transistor 54 will pass much more current than the collector 51-to-base 27 junction of transistor 32 for a given forward voltage because NPN transistor 54 has significantly higher impurity concentrations in its emitter-base junction. Therefore clamp transistor 54 tends to forward bias and become much more conductive than the collector 51-to-base 27 junction of device 32. Thus, as the collector potential of transistor 20 rises to a value that would otherwise heavily saturate transistor 32, clamp transistor 54 turns on and conducts more drive current to NPN complementary output transistor 52. Thus, as indicated in FIG. 2c, at time T1 when transistor 32 otherwise would have heavily saturated resulting in a decrease in the amount of base drive to device 52, now clamp transistor 54 provides base drive for transistor 52 thus enabling the magnitude 76 of the output voltage to remain at a fairly high level.

Bias setting device 26 is an active PNP transistor rather than the NPN diode-connected transistor used in prior art structures. Since transistor 26 is a PNP device it has the same saturation current per unit area as PNP complementary output device 28. Thus, the emitter current of transistor 28 has a direct relation to the emitter current of transistor 26 depending on the relative areas between the devices. Thus, the establishment of a predetermined current magnitude through devices 56 and 26 provides a predictable bias current through complementary output devices 52 and 28. As a result, the amount of current through transistors 28 and 52 can be reduced to a greater degree because the tolerances thereof are not as great. Transistors 56 and 26 bias complementary output transistors 52 and 28 in a known class AB mode so as to prevent cross-over distortion in the amplifier.

What has been described in an improved bias circuit configuration for complementary transistors 28 and 52. The bias circuit configuration is suitable for being manufactured in monolithic integrated circuit form. A clamp transistor 54 minimizes distortion of the output waveform at output terminal 14 by providing additional drive to transistor 52 and also enables current generator device 30 to provide currents to sinks 42, 44 and 48 of constant magnitude by shunting current otherwise conducted through the forward biased collector 51-to-base 27 junction.

What is claimed is:

1. A circuit for limiting the saturation of a multiple collector transistor of a first conductivity type having at least first and second collector electrodes, including in combination:

driver circuit means having an output terminal thereof connected to the first collector electrode of the multiple collector transistor, said driver circuit means tending to allow the first collector-to-base junction of the multiple collector transistor to forward bias thereby forcing said multiple collector transistor into a high degree of saturation;

output transistor means having a control electrode connected to the second collector electrode of the multiple collector transistor; and clamp transistor means of the second conductivity type having a control electrode connected to the first collector electrode, a first main electrode connected to said output terminal of said driver circuit means, and a second main electrode connected to the second collector electrode and to said control electrode of said output transistor means, said clamp transistor means being rendered conductive in response to the potential at the output terminal of the driver circuit means approaching the saturation level of the first collector-to-base junction of the multiple collector transistor so that at least part of the current otherwise provided through the first collector-to-base junction of the multiple collector transistor is provided to said control electrode of said output transistor means.

2. The circuit of claim 1 wherein said multiple collector transistor is of a PNP conductivity type, said clamp transistor means is of an NPN conductivity type, and said output transistor means is of an NPN conductivity type.

3. The circuit of claim 1 further including a current supply connected to the base electrode of the multiple collector transistor, said clamp transistor means shunting a substantial portion of the saturation current otherwise undesirably conducted to said current supply by said first collector-to-base junction of said multiple collector transistor, and which saturation current would otherwise undesirably disturb the magnitude of the current provided by said current supply.

4. An amplifier circuit having complementary output devices and a bias supply circuit tending to provide a saturation current having an undesirable magnitude, the bias supply circuit having a multiple collector transistor with at least first and second collectors, the first collector providing current to one of the complementary output devices, a circuit for limiting the magnitude of the saturation current of the bias supply circuit to a desirable level, including in combination:

a driver circuit having an output terminal coupled to the complementary devices and to the second collector of the multiple collector transistor;

a current supply connected to the base electrode of the multiple collector transistor, said current supply providing at least one output current having a magnitude that tends to be undesirably disturbed as a result of said driver circuit providing a potential at the output terminal thereof which tends to forward bias and thereby saturate the second collector-to-base junction of the multiple collector transistor; and current shunt transistor means having a control electrode connected to said output terminal of said driver circuit and to the second collector of the multiple collector transistor, a first main electrode connected to the control electrode of one of the complementary output devices, and a second main electrode connected to the output terminal of said driver circuit, said current shunt transistor means being rendered conductive by the potential provided by said driver circuit which tends to saturate said second collector-to-base junction of said multiple collector transistor so that said current shunt transistor means provides to said one of the complementary output devices substantially all the saturation current which would otherwise undesirably disturb the magnitude of the output current of the current supply.

5. The amplifier circuit of claim 4 wherein said current shunt transistor means and the multiple collector transistor are of opposite conductivity types.

6. The amplifier circuit of claim 4 wherein said current supply includes a further multiple collector transistor having a base electrode electrically connected to the base electrode of said multiple collector transistor, said base electrode of said further multiple collector transistor being connected to one of said collectors of said further multiple collector transistor, and other collectors of said multiple collector transistor providing output currents having magnitudes which tend to be undesirably disturbed by the saturation current.

7. A circuit for limiting the saturation current of a protected transistor having an emitter electrode, a base electrode, and first and second collector electrodes, including in combination:

control circuit means having an output terminal coupled to the first collector electrode of the protected transistor, said control circuit means tending to allow the first collector-to-base junction of the protected transistor to forward bias thereby undesirably forcing the protected transistor into a high degree of saturation;

current sink means having an input terminal; and current shunt means having a first electrode and a second electrode, said first electrode being connected to the first collector electrode of the protected transistor and to said output terminal of said control circuit means, said second electrode being connected to said input terminal of said current sink means and to said second collector electrode, said current shunt means being rendered conductive in response to the potential at the output terminal of the control circuit means approaching the saturation level of the protected transistor so that at least part of the current otherwise provided through the first collector-to-base junction of the protected transistor is provided to said input terminal of said current sink means.

* * * * *